United States Patent [19]
Higa

[11] Patent Number: 5,295,108
[45] Date of Patent: Mar. 15, 1994

[54] ELECTRICALLY ERASABLE AND PROGRAMMABLE READ ONLY MEMORY DEVICE WITH SIMPLE CONTROLLER FOR SELECTING OPERATIONAL SEQUENCES AFTER CONFIRMATION

[75] Inventor: Tomoko Higa, Tokyo, Japan
[73] Assignee: NEC Corporation, Tokyo, Japan
[21] Appl. No.: 44,167
[22] Filed: Apr. 8, 1993
[30] Foreign Application Priority Data
Apr. 8, 1992 [JP] Japan .................. 4-115423
[51] Int. Cl.⁵ .............................. G11C 13/00
[52] U.S. Cl. .................. 365/218; 365/189.01; 365/900
[58] Field of Search ........... 365/218, 189.01, 230.01, 365/189.04, 900

[56] References Cited
U.S. PATENT DOCUMENTS
5,218,607 6/1993 Saito et al. .................. 365/228

OTHER PUBLICATIONS
"28F001BX-T/28F001BX-B 1M(128K×8) CMOS Flash Memory", Intel Corporation, Mar. 1991, pp. 1-28.

*Primary Examiner*—Terrell W. Fears
*Attorney, Agent, or Firm*—Sughrue, Mion, Zinn, Macpeak & Seas

[57] ABSTRACT

An electrically erasable and programmable read only memory device is responsive to an external command signal for selectively executing an erasing operation, a write-in operation and a verifying operation, and a controller is incorporated in the electrically erasable and programmable read only memory device for producing internal control signals from the external command signal, wherein the external command signal is split into higher order bits and lower order bits both indicative of the external command, and the controller compares the higher order bits with the lower order bits so as to exactly discriminate the external command.

6 Claims, 4 Drawing Sheets

ELECTRICALLY ERASABLE AND PROGRAMMABLE READ ONLY MEMORY DEVICE WITH SIMPLE CONTROLLER FOR SELECTING OPERATIONAL SEQUENCES AFTER CONFIRMATION

FIELD OF THE INVENTION

This invention relates to an electrically erasable and programmable read only memory device and, more particularly, to an electrically erasable and programmable read only memory device with a controller responsive to an external command signal for controlling operational sequences.

DESCRIPTION OF THE RELATED ART

An electrically erasable and programmable read only memory device such as a flash memory selectively enters an erasing mode, a programming mode and a read-out mode of operation, and executes an erasing sequence, a programming sequence and a read-out sequence. In order to prevent the memory cells from excessively erased state and excessively write-in state, the electrically erasable and programmable read only memory device repeats a short erasing operation and a short write-in operation each followed by a verifying operation. In other words, the erasing sequence and the programming sequence consist of the short erasing operations each followed by the verifying operation and the short write-in operations each followed by the verifying operation. For this reason, the electrically erasable and programmable read only memory device is equipped with a controller, and the controller supervises the component circuits for executing the erasing operation, the write-in operation and the verifying operation on the basis of an external command signal.

FIG. 1 illustrates the internal circuit arrangement of the prior art electrically erasable and programmable read only memory device, and largely comprises a memory cell array 1 implemented by floating gate type field effect transistors, peripheral circuits 2 for addressing, data transmission and voltage distribution, and a controller 3. The controller 3 includes a command decoder 3a coupled with a data input/ output port 4a, and a latch circuit 3b for storing a decoded command signal indicative of either erasing operation, write-in operation or verifying operation. The latch circuit 3b is coupled through internal command signal lines 3c, 3d and 3e with the peripheral circuits 2, and controls the peripheral circuits 2 for the erasing operation, the write-in operation and the verifying operation. The data input/ output port 4a is further coupled with the peripheral circuits 2, and an n-bit external command signal and an n-bit external input data signal are distributed to the command decoder 3a and to the peripheral circuits 2, respectively.

An address port 4b is directly coupled with the peripheral circuits 2, and supplies address information thereto. The prior art electrically erasable and programmable read only memory device further has a control signal port 4c, and various external control signals such as a chip enable signal and a write enable signal are supplied to the peripheral circuits 2. In this instance, the chip enable signal and the write enable signal are further supplied to the command decoder 3a, and the command decoder 3a discriminates the external command signal from the external input data signal. For example, if an external device requests the write-in operation, the chip enable signal goes down to low level at time t1 as shown in FIG. 2, and supplies the external command signal indicative of the write-in operation to the data input-/output port in synchronism with the first step-down of the write enable signal at time t2. Then, the command decoder 3a acknowledges the external command signal at the input/output data port 4a, and produces the command decoded signal from the n-bit external command signal. The latch circuit 3b latches the n-bit command decoded signal, and supplies the internal command signals for the write-in operation through the internal command signal lines 3c to the peripheral circuits 2. The external device allows the write enable signal to recover from the low level at time t3, and supplies an n-bit data signal to the input/output data port 4a in synchronism with the second step-down of the write enable signal at time t4. The command decoder 3a ignores the n-bits at the input/output data port 4a, and the n-bit input data signal is latched by a write-in circuit forming a part of the peripheral circuits 2. The peripheral circuits 2 are sequentially activated with the internal command signals, and the n-bit input data signal are written into the memory cells assigned the address indicated by the external address signal at the address port 4b.

However, a problem is encountered in the prior art electrically erasable and programmable read only memory device in mistakenly discriminating the external command signal, and the error of discrimination results in destruction of data.

SUMMARY OF THE INVENTION

It is therefore an important object of the present invention to provide an electrically erasable and programmable read only memory device which exactly discriminates an external command signal indicative of an operational sequence.

To accomplish the object, the present invention proposes to code an external command into first bits of an external command signal as well as into second bits of the external command signal for allowing an electrically erasable and programmable read only memory device to confirm the external command through comparison.

In accordance with the present invention, there is provided an electrically erasable and programmable read only memory device fabricated on a semiconductor chip, comprising: a) a plurality of electrically erasable and programmable memory cells for storing data bits each either first or second logic level; b) peripheral circuits for selectively carrying out an erasing operation for shifting data bit stored in the electrically erasable and programmable memory cells to the first logic level, a write-in operation for shifting data bits stored in the electrically erasable and programmable read only memory cells to the second logic level and a verifying operation for checking the data bits to see whether the data bits are in the first logic level or in the second logic level; c) a comparator operative to compare first bits of an external command signal with second bits of the external command signal to see whether or not a command indicated by the first bits is consistent with a command indicated by the second bits, and producing an enable signal when the first bits are consistent with the second bits; and d) a controller enabled with the enable signal, and selectively producing internal control signals from the external command signal for the erasing operation, the write-in operation and the verifying operation.

The first and second bits of the external command signal may be equal in number to the bits of a write-in data signal.

BRIEF DESCRIPTION OF THE DRAWINGS

The features and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 1:
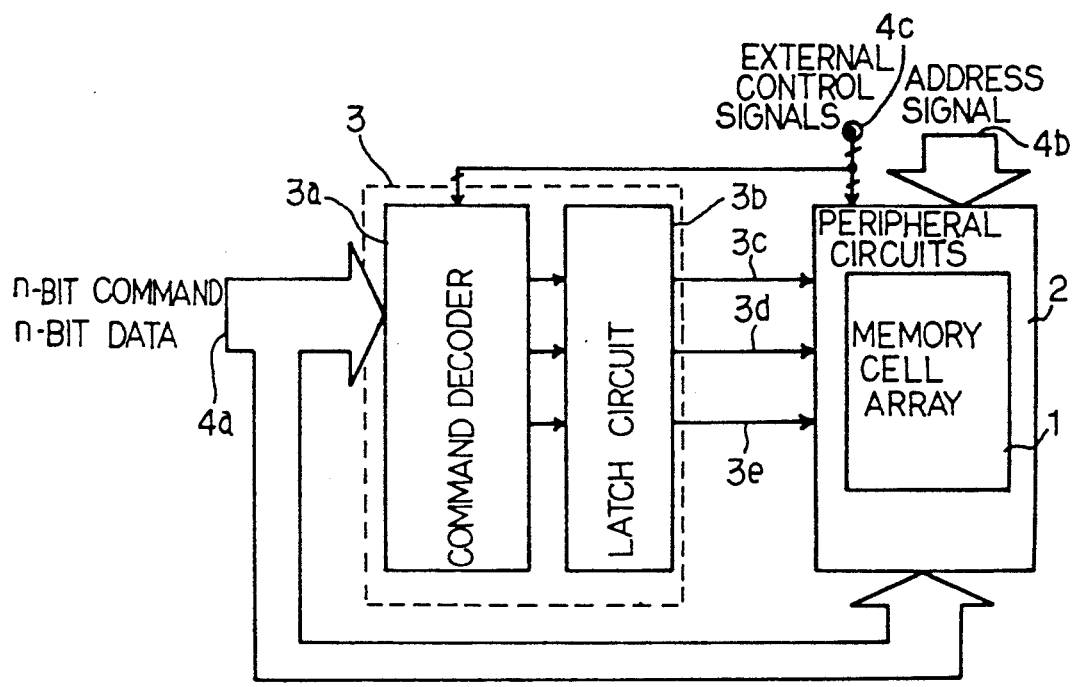
FIG. 1 is a block diagram showing the arrangement of the prior art electrically erasable and programmable read only memory device.
Figure 2:
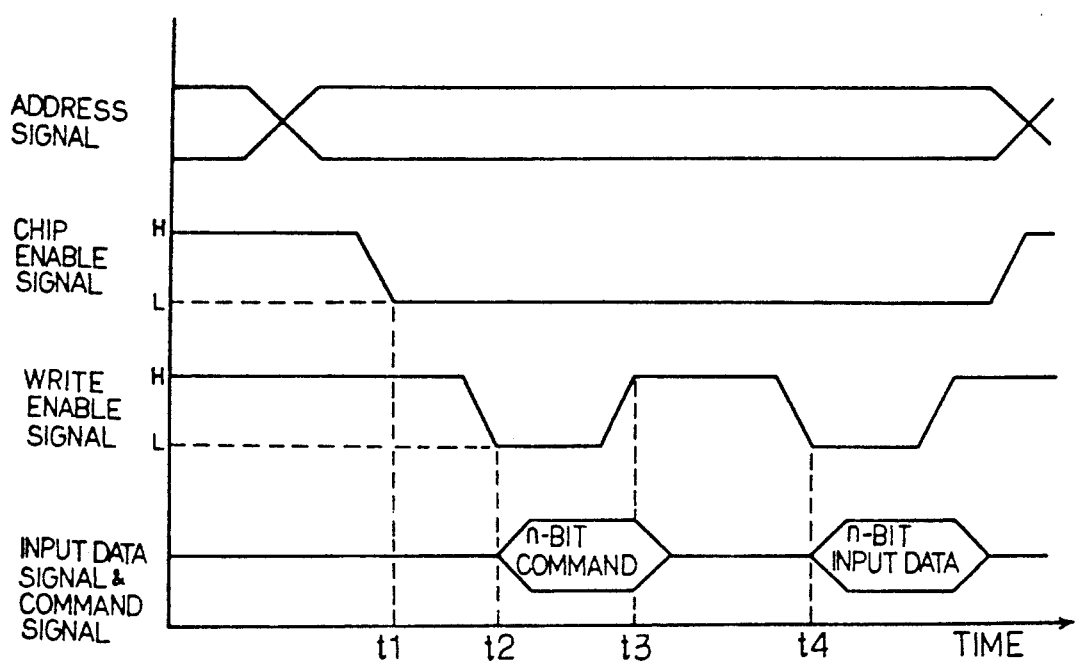
FIG. 2 is a timing chart showing the command entry for the write-in operation.
Figure 3:
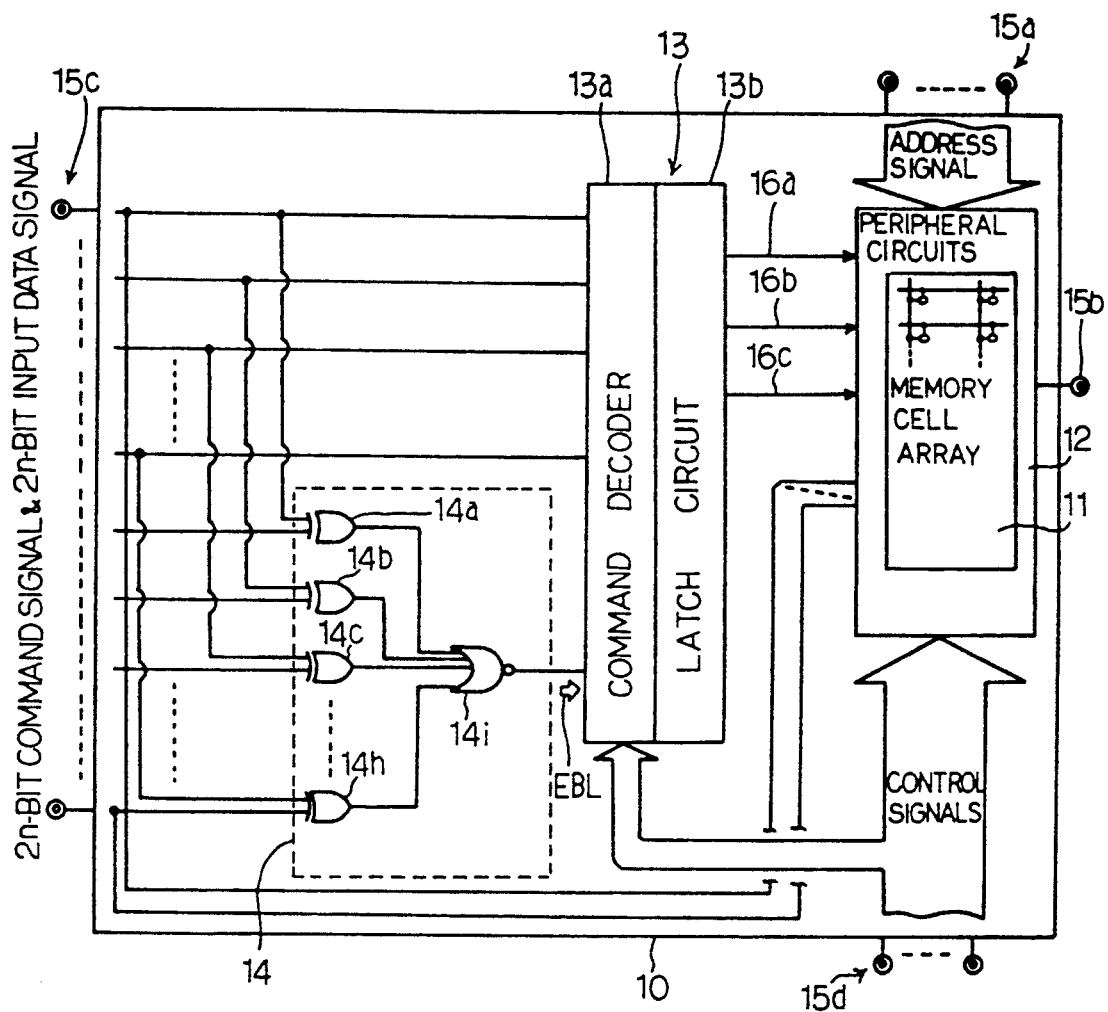
FIG. 3 is a block diagram showing the circuit arrangement of an electrically erasable and programmable read only memory device according to the present invention.

Referring to FIG. 3 of the drawings, an electrically erasable and programmable read only memory device embodying the present invention is fabricated on a semiconductor chip 10, and largely comprises a memory cell array 11, peripheral circuits 12, a controller 13 and a comparator 14. The memory cell array 11 is implemented by electrically erasable and programmable read only memory cells, and small bubbles are respectively indicative of the electrically erasable and programmable read only memory cells forming parts of the memory cell array 11. In this instance, the electrically erasable and programmable read only memory cells are floating gate type field effect transistors, and selectively enter erased state with relatively low threshold level and write-in state with relatively high threshold level. The high and low threshold levels are corresponding to two logic levels, and a data bit is stored in each electrically erasable and programmable read only memory cell in the form of threshold level.

The electrically erasable and programmable read only memory device selectively enters an erasing mode, a programming mode and a read-out mode, and the peripheral circuits carry out an erasing sequence in the erasing mode, a programming sequence in the programming mode and a read-out sequence in the read-out mode of operation. The peripheral circuits 12 select one of or a group of electrically erasable and programmable read only memory cells indicated by an external address signal applied to an address port 15a, and provides a data propagation path between the selected electrically erasable and programmable read only memory cell or cells and an output data port 15b or an input data port 15c. In this instance, the input data port 15c may have sixteen data pins. However, the present invention is applicable to any electrically erasable and programmable read only memory device with an n-bit input data port. The peripheral circuits 12 are further operative to distribute power voltages and write-in voltage to selected circuits and the memory cell array 11 depending upon the mode of operation, and are communicable through a control signal port 15d with an external device. With external control signals supplied to the control signal port 15d, the peripheral circuits acknowledge a requested operational sequence, i.e., either erasing, programing or read-out sequence, and controls the sequences.

The controller 13 comprises a command decoder 13a coupled with one of the upper bits and the lower bits forming the data input port 15c and enabled in the concurrent presence of a chip enable signal of active low level, a write enable signal of active low level and an internal enable signal EBL of active high level, and a latch circuit 13b for storing decoded command signals from the command decoder 13a. While the internal enable signal EBL remains in the active high level, the command decoder 13a serves as similar to the command decoder 3a incorporated in the prior art electrically erasable and programmable read only memory device. However, if the internal enable signal EBL goes down to inactive low level, the command decoder 13a ignores an external command represented by one of the upper bits and the lower bits of an external command signal. The latch circuit 13b selectively drives the control signal lines 16a, 16b and 16c, and supplies internal control signals for an erasing operation, a write-in operation and a verifying operation. In the erasing sequence, the peripheral circuits 12 carry out the write-in operation on all of the electrically erasable and programmable read only memory cells, and repeat the erasing operation and the verifying operation on all of the electrically erasable and programmable read only memory cells for preventing the electrically erasable and programmable read only memory cells from excessively erased state.

While the electrically erasable and programmable read only memory device carries out the programming sequence on the basis of an 2n-bit write-in data signal at the input data port 15c, the write-in operation followed by the verifying operation are repeated on the electrically erasable and programmable read only memory cells indicated on the address signal at the address port 15a for preventing the electrically erasable and programmable read only memory cells from excessively write-in state.

The read-out sequence is relatively simple. Namely, the peripheral circuits 12 selects one of or a group of electrically erasable and programmable read only memory cells indicated by the address signal, and checks the selected electrically erasable and programmable read only memory cell or cells to see whether or not the threshold level or levels are either high or low for producing an output data signal.

The comparator 14 comprises n exclusive-OR gates 14a, 14b, 14c, ... and 14h, and a NOR gate 14i, and produces the internal enable signal EBL of active high level when the higher order or n bits of an 2n-bit external command signal are consistent with the lower order or n bits of the 2n-bit external command signal. In the following description, the high level is assumed to be logic "1" level. The n data pins of the port 15c are coupled with the first input nodes of the respective exclusive-OR gates 14a to 14h, and the other n data pins of the port 15c are coupled with the second input nodes of the respective exclusive-OR gates 14a to 14h. The output nodes of the exclusive-OR gates 14a to 14h are coupled with the input nodes of the NOR gate 14i, and the output signals of the exclusive-OR gates 14a to 14h are NORed with one another. An external command indicative of either erasing, write-in or verifying operation is represented by the higher order n-bits of the external command signal, and the lower order n-bits are also indicative of the external command. For example, if the external command for the write-in operation is represented as "20(H)", the external command signal for the write-in operation is constituted by the 2n-bits of "2020(H)". The exclusive-OR gates 14a to 14h compares the lower order bits with the higher order bits, and yield the output signals of logic "0" level in so far as the lower order n-bits are consistent with the high order 2n-bits. However, if one of the lower order n-bits is inconsistent with the corresponding higher order bit, the exclusive-OR gate produces the output signal of logic "1" level. The NOR gate 14i produces the internal enable signal EBL of logic "1" level in the concurrent presence of the output signals of logic "0" level. However, the NOR gate 14i keeps the internal enable signal EBL in logic "0" level in the presence of at least one output signal of logic "1" level, and the operational sequences are hardly affected by noises on the external data bus coupled with the input data port 15c.

As will be appreciated from the foregoing description, the electrically erasable and programmable read only memory device according to the present invention confirms the external command through the comparing operation between the higher order bits and the lower order bits, and the command decoder 13a exactly produces the internal control signal from the external command signal. As a result, the electrically erasable and programmable read only memory device according to the present invention is free from data destruction due to mistakenly discriminated external command.

Second Embodiment

Figure 4:
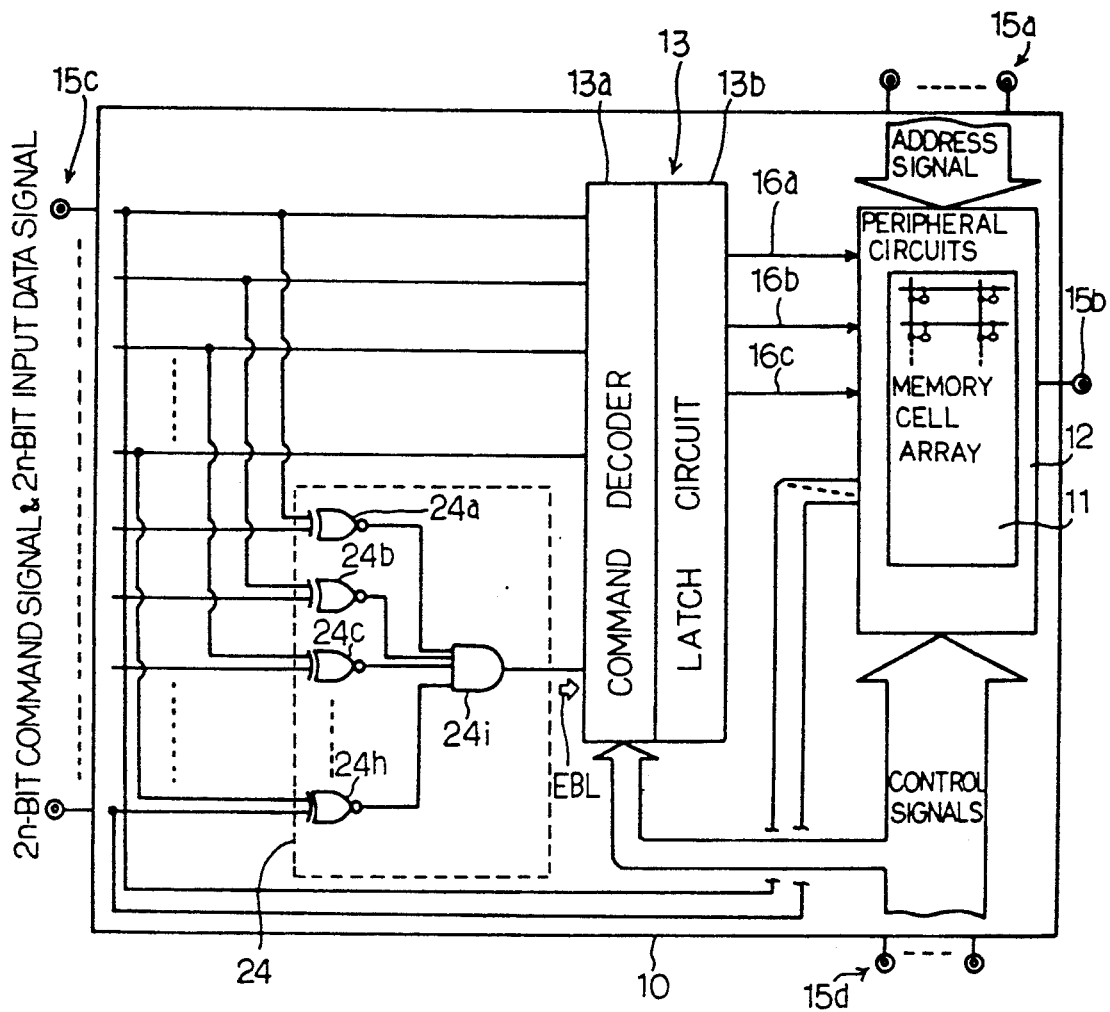
FIG. 4 is a logic diagram showing a comparator incorporated in another electrically erasable and programmable read only memory device according to the present invention.

Turning to FIG. 4 of the drawings, another electrically erasable and programmable read only memory device embodying the present invention is fabricated on a semiconductor chip. The electrically erasable and programmable read only memory device implementing the second embodiment is similar in arrangement to the first embodiment except for a comparator 24, and the other component circuits are labeled with the same references as those designating the corresponding circuits of the first embodiment without any detailed description.

The comparator 24 comprises n exclusive-NOR gates 24a to 24h and an AND gate 24i, and the n-bits of the port 15c and the other n-bits are coupled with the first input nodes and the second input nodes of the n exclusive-NOR gates 24a to 24h. If the higher order n-bits of an 2n-bit command signal is matched with the lower order n-bits of the 2n-bit command signal, the exclusive-NOR gates 24a to 24h yield the output signals of logic "1" level, and allows the AND gate 24i to produce an enable signal EBL of active logic "1" level. However, if one of the n-bits is inconsistent with the corresponding bit, at least one exclusive-NOR gate keeps the output signal in logic "0" level, and the AND gate 24i also keeps the enable signal EBL in inactive logic "0" level.

Although the particular embodiment of the present invention has been shown and described, it will be obvious to those skilled in the art that various changes and modifications may be made without departing from the spirit and scope of the present invention. For example, the electrically erasable and programmable read only memory device may form a part of a large scale integration.

What is claimed is:

1. An electrically erasable and programmable read only memory device fabricated on a semiconductor chip, comprising:
   a) a plurality of electrically erasable and programmable memory cells for storing data bits each either first or second logic level;
   b) peripheral circuits for selectively carrying out an erasing operation for shifting data bit stored in the electrically erasable and programmable memory cells to said first logic level, a write-in operation for shifting data bits stored in the electrically erasable and programmable read only memory cells to said second logic level and a verifying operation for checking the data bits to see whether the data bits are in the first logic level or in the second logic level;
   c) a comparator operative to compare first bits of an external command signal with second bits of said external command signal to see whether or not a command indicated by said first bits is consistent with a command indicated by said second bits, and producing an enable signal when said first bits are consistent with said second bits; and
   d) a controller enabled with said enable signal, and selectively producing internal control signals from said external command signal for said erasing operation, said write-in operation and said verifying operation.

2. An electrically erasable and programmable read only memory device as set forth in claim 1, in which the total number of said first and second bits of said external command signal is equal to the number of bits of a write-in data signal used in said write-in operation.

3. An electrically erasable and programmable read only memory device as set forth in claim 2, in which further comprising a data port shared between said external command signal and said write-in data signal.

4. An electrically erasable and programmable read only memory device as set forth in claim 1, in which said comparator comprises c-1) a plurality of exclusive-OR gates having respective first input nodes respectively supplied with said first bits and respective second input nodes respectively supplied with said second bits and operative to produce respective output signals each indicative of either consistence or inconsistence between the first and second bits, and c-2) a logic gate coupled with the output nodes of said plurality of exclusive-OR gates for producing said enable signal when all of said output signals are indicative of consistence.

5. An electrically erasable and programmable read only memory device as set forth in claim 4, in which said controller comprises d-1) a command decoder enabled with said enable signal and responsive to said first bits or said second bits for selectively producing said internal control signals, and d-2) a latch circuit for storing said internal control signals.

6. An electrically erasable and programmable read only memory device as set forth in claim 1, in which said comparator comprises c-1) a plurality of exclusive-NOR gates having respective first input nodes respectively supplied with said first bits and respective second input nodes respectively supplied with said second bits and operative to produce respective output signals each indicative of either consistence or inconsistence between the first and second bits, and c-2) an AND gate coupled with the output nodes of said plurality of exclusive-NOR gates for producing said enable signal when all of said output signals are indicative of consistence.

* * * * *